(12) United States Patent
Haffner et al.

(10) Patent No.: US 7,945,869 B2
(45) Date of Patent: May 17, 2011

(54) MASK AND METHOD FOR PATTERNING A SEMICONDUCTOR WAFER

(75) Inventors: Henning Haffner, Pawling, NY (US); Scott M. Mansfield, Hopewell Junction, NY (US)

(73) Assignees: Infineon Technologies AG, Neubiberg (DE); International Business Machines Corporation, Armonk, NY (US)

( * ) Notice: Subject to any disclaimer, the term of this patent is extended or adjusted under 35 U.S.C. 154(b) by 588 days.

(21) Appl. No.: 11/841,418

(22) Filed: Aug. 20, 2007

(65) Prior Publication Data

US 2009/0053654 A1    Feb. 26, 2009

(51) Int. Cl.
*G06F 17/50* (2006.01)
*G03F 1/00* (2006.01)

(52) U.S. Cl. .............................. 716/50; 716/55; 430/5

(58) Field of Classification Search ............. 716/19–21, 716/50, 54–55
See application file for complete search history.

(56) References Cited

U.S. PATENT DOCUMENTS

| | | | |
|---|---|---|---|
| 5,563,012 A | 10/1996 | Neisser | |
| 6,596,444 B2 * | 7/2003 | Buck | 430/5 |
| 7,644,389 B2 * | 1/2010 | Hennig et al. | 716/21 |
| 2002/0076624 A1 * | 6/2002 | Buck | 430/5 |
| 2004/0010770 A1 * | 1/2004 | Broeke et al. | 716/21 |
| 2005/0125765 A1 * | 6/2005 | Broeke et al. | 716/21 |
| 2007/0196744 A1 * | 8/2007 | Hennig et al. | 430/5 |
| 2007/0288881 A1 * | 12/2007 | Maheshwarla et al. | 716/19 |
| 2008/0020296 A1 * | 1/2008 | Hsu et al. | 430/5 |

* cited by examiner

*Primary Examiner* — Stacy A Whitmore
(74) *Attorney, Agent, or Firm* — Slater & Matsil, L.L.P.

(57) ABSTRACT

A method for generating a mask pattern is provided. A target lithographic pattern comprising a plurality of first geometric regions is provided, wherein the regions between the plurality of first geometric regions comprise first spaces. The target lithographic pattern is transformed, and the transformed pattern is decomposed into a first pattern and a second pattern.

26 Claims, 20 Drawing Sheets

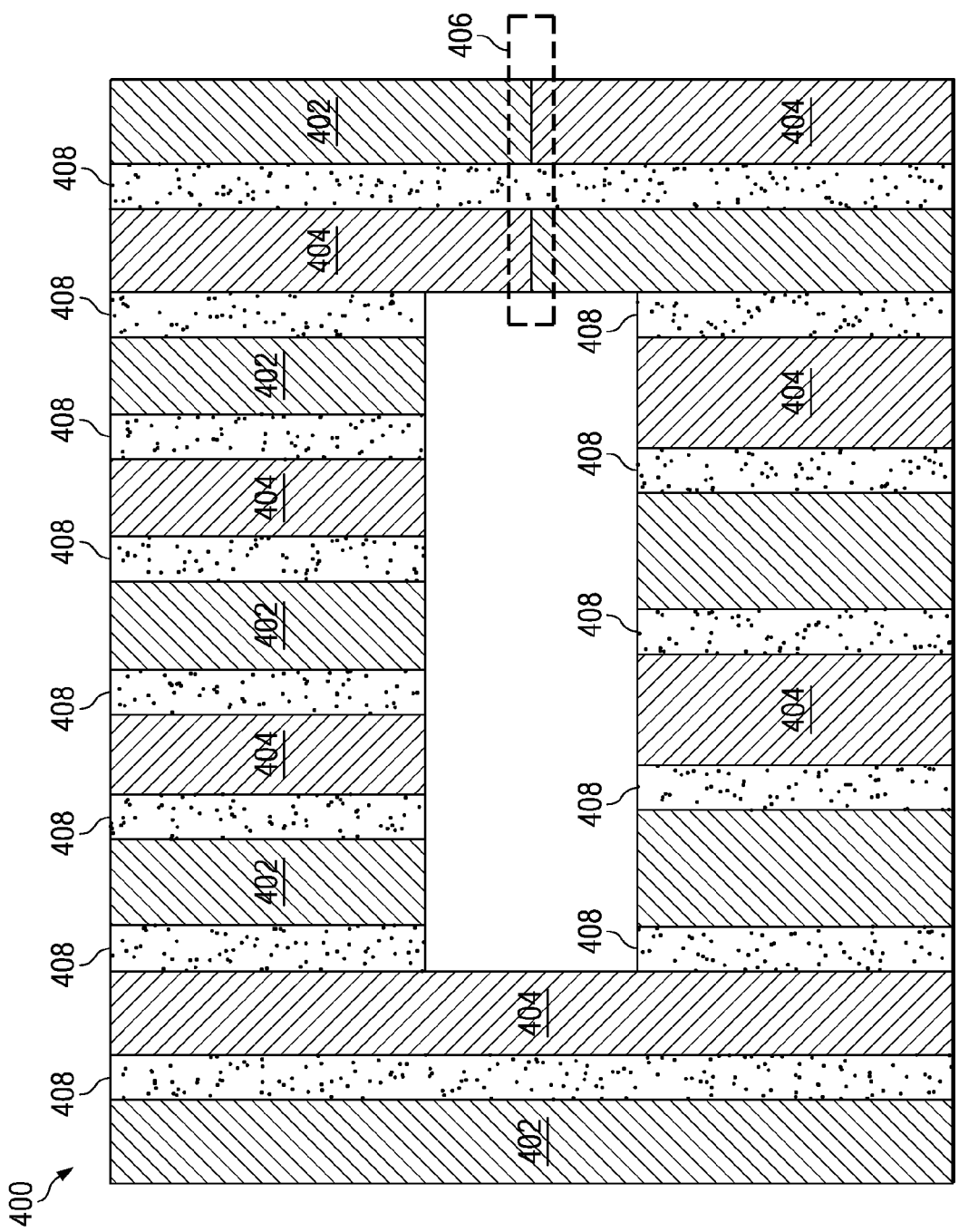
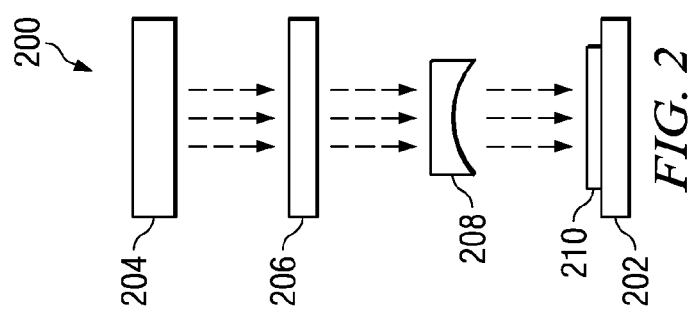
FIG 4a
FIG. 2

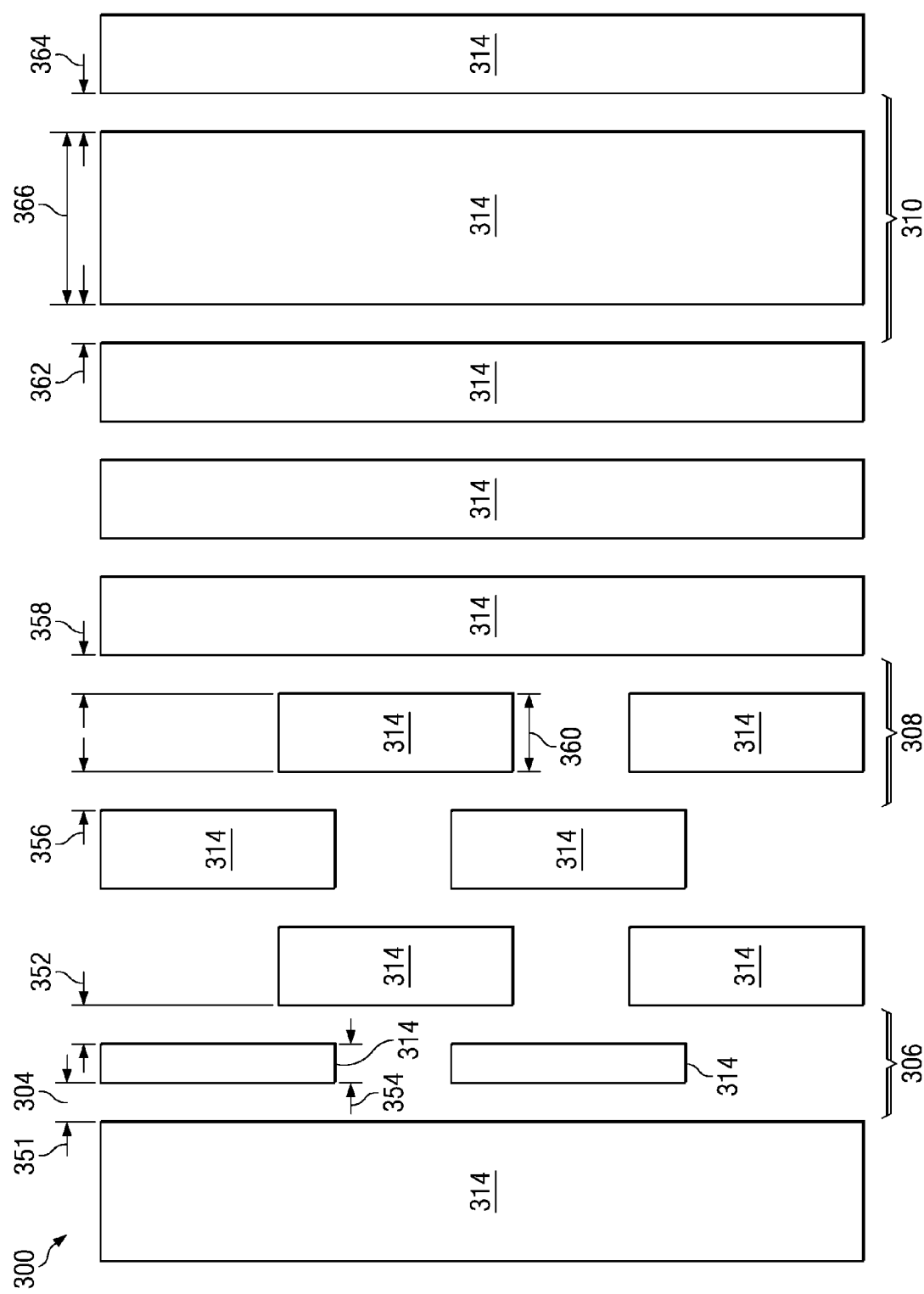

MASK AND METHOD FOR PATTERNING A SEMICONDUCTOR WAFER

TECHNICAL FIELD

This invention relates generally to semiconductor devices and methods, and more particularly to a mask and method for patterning a semiconductor wafer.

BACKGROUND

The accurate reproduction of patterns on the surface of a semiconductor substrate is critical to the proper fabrication of semiconductor devices. The semiconductor substrate may have undergone previous fabrication processes and may already feature layers and structures created by those fabrication processes. Improperly reproduced patterns can result in semiconductor devices that do not operate to design specifications or that do not operate at all. For example, transistors can be created with improperly sized gates; conductors can be created that are short circuited or open circuited with other conductors or devices; structures can be created with wrong geometries, and so forth. Improperly reproduced patterns can reduce the yield of the fabrication process, thereby increasing the overall cost of the product. The reproduction process typically involves the use of optical lithography to reproduce the patterns onto the surface of the semiconductor substrate followed by a variety of processes either to subtract (for example, etch) or to add (for example, deposit) materials from and to the semiconductor substrate.

However, as the dimensions of the structures making up the patterns continue to become smaller, their sizes approach the wavelengths of the light used in optical lithography. Interference and processing effects can cause distortion and deviation in the mask's patterns as they are reproduced onto the semiconductor substrate. One cause of such pattern deviation is associated with the difficulties of locally exposing regions of the semiconductor wafer to the correct amount of light at each individual local region during fabrication. Exposure settings (i.e. focus and dose) needed to adequately expose a particular region on a wafer are typically dependent on the feature density of the particular region's local geometry. If any region of the wafer is incorrectly exposed to the light passing though the mask, regions of the photosensitive resist may be overexposed or underexposed which will lead to device failure. Unfortunately, as device geometries shrink, an exposure setting that may be suitable for one particular region of the wafer with a particular feature density may overexpose or underexpose another region of the wafer with a different feature density, thereby making it impossible to expose the wafer in a single mask exposure.

In the field of small, densely packed applications using small geometry transistors, what is needed is a mask method and structure that can optimally expose all critical dimension regions of varying densities.

SUMMARY OF THE INVENTION

In one embodiment of the present invention, a method for generating a mask pattern is provided. A target lithographic pattern comprising a plurality of geometric regions is provided, wherein the regions between the geometric regions comprise spaces. The target lithographic pattern is transformed, and the transformed pattern is decomposed into a first pattern and a second pattern.

The foregoing has outlined rather broadly features of the present invention. Additional features of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 is a diagram of the photolithography system;

FIGS. 3a-3m illustrate an embodiment process for decomposing a mask set;

FIGS. 4a-4c illustrate an alternate embodiment for decomposing a mask set;

Figure 1:
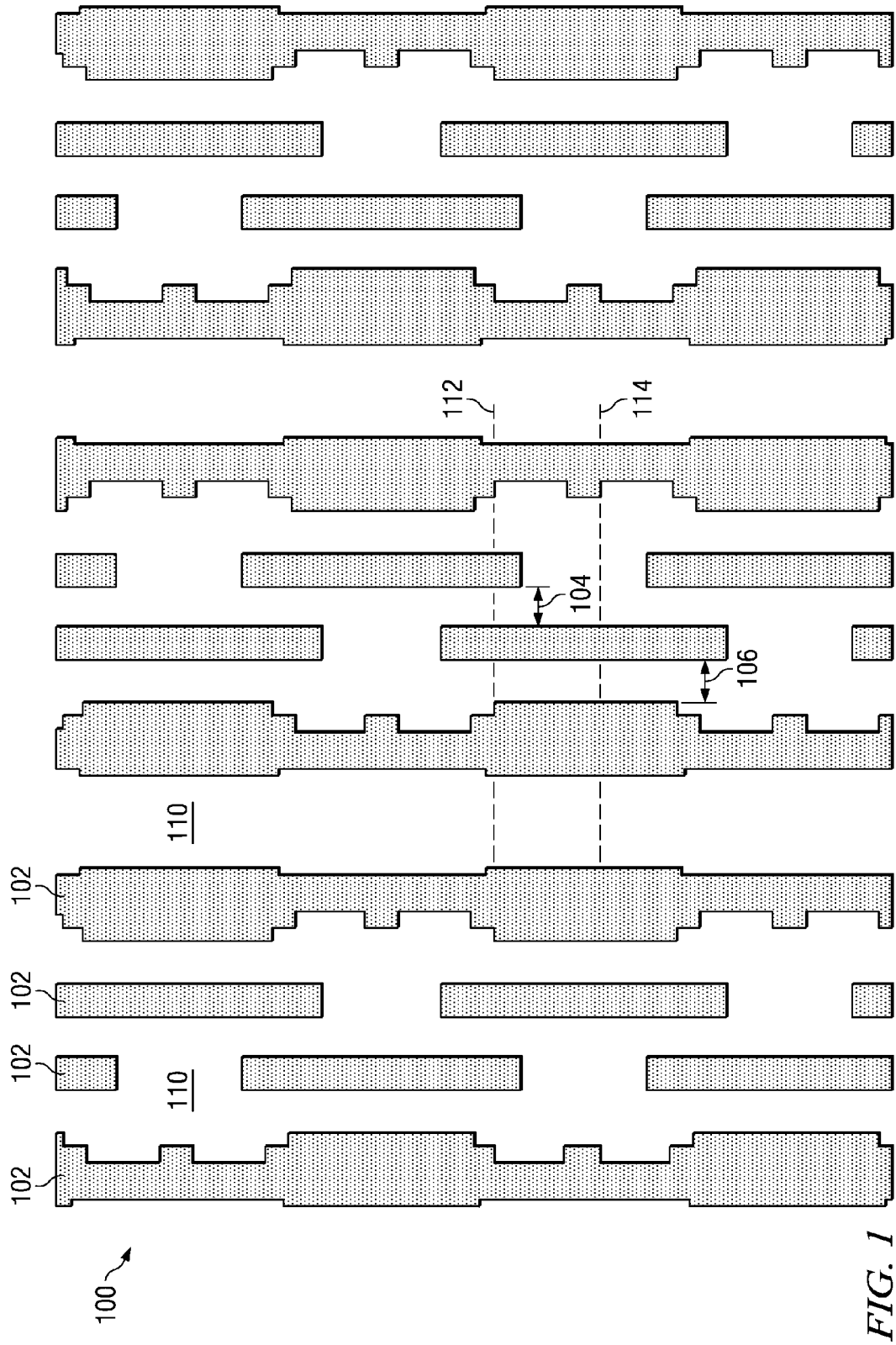
FIG. 1 illustrates a layout view of a typical target pattern.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating a variation of the same structure, material, or process step may follow a figure number.

DETAILED DESCRIPTION OF ILLUSTRATIVE EMBODIMENTS

The making and using of preferred embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to preferred embodiments in a specific context, namely an optical lithography system for the reproduction of patterns of very small dimensions. The invention may also be applied, however, to semiconductor fabrication processes with other forms of lithography where the wavelength of the electromagnetic waves used to transfer the patterns approaches the dimensions of the patterns. The invention can also be used in lithography processes outside the semiconductor field. For example, the invention can be applied to lithography processes with density dependent optimal process windows. A problem solved by the embodiments of the invention will first be described. The invention will then be described with respect to preferred embodiments in a specific context, namely a method for exposing a pattern on a semiconductor wafer. The invention will be described in regard to a "correct positive" lithography process where designed shapes correspond to opaque features on the photomask and the pattern is transferred into a positive-tone photoresist. In a positive-tone photoresist, regions that are exposed to electromagnetic waves undergo a chemical change that result in the photoresist material being removed during the development process. The designed opaque features are therefore transferred onto the semiconductor wafer as corresponding photoresist features that remain after the exposure and development process. It is understood, that the invention would work equally well in a "correct negative" process where designed shapes correspond to clear features on the photomask and the pattern is transferred into a negative-tone resist. In a negative-tone resist, regions exposed to electromagnetic waves undergo a chemical change that result in the photoresist remaining on the wafer after the development process. So, in the correct negative process, designed shapes are also transferred onto the wafer as corresponding photoresist features that remain after the exposure and development process. Concepts of the invention can also be applied to other lithographic processes.

One problem with providing the required focus and illumination to expose small features during the semiconductor manufacturing process is that the range of acceptable exposure settings (commonly known in the art as a "lithographic process window") is dependent on mask density. These exposure settings typically comprise a focus and an illumination intensity known as a dose. For example, exposure settings required to adequately expose a region populated with small or critical distance features separated by a small or critical dimension may be outside the process window of exposure settings needed to expose a region populated with critical distance features separated by an intermediate dimension.

FIG. 1 shows a diagram illustrating an exemplary pattern 100 that is to be reproduced on a semiconductor wafer. The pattern 100 includes a plurality of structures 102 that correspond to lithographically non-exposed regions and spaces 110 that correspond to lithographically exposed regions. Lengths 104 and 106 denoted by the double-sided arrows on the figure denote exposed distances of a critical dimension, and dotted lines 112 and 114 denote one-dimensional axes along which an exposure setting can be optimized. Along axis 112 are two exposed regions, or spaces, of critical dimension denoted by measurement 104 and 106. Axis 114, however, intersects only one exposed region of critical dimension denoted by length 106. Because axes 112 and 114 intersect different densities of exposed regions, the optimal exposure settings required for each axis is different.

At very small critical dimensions on the order of 45 nm, 32 nm, or smaller, however, required process windows become very narrow. Process windows optimized for one particular pattern density may be inappropriate or ineffective for another pattern density. For example, the exposure settings required to expose pattern 100 along axis 112 results in illumination conditions that may overexpose the features along axis 114, while the exposure settings required to adequately expose pattern 100 along axis 114 results in a different preferred illumination condition that may underexpose pattern 100 along axis 112.

In various embodiments of the invention, a mask can be designed to improve the pattern and structures created on the surface of the silicon wafer. An apparatus 200 for patterning the surface of a semiconductor wafer 210 is shown in FIG. 2. A stage 202 is adapted to support a semiconductor wafer 210. The stage 202 may be adapted to move the entire semiconductor wafer 210 from position to position in order to expose portions of a resist over the surface of semiconductor wafer 210 during the patterning process. The stage 202 may be mounted on a base, not shown. The stage 202 is adapted to securely hold semiconductor wafer 210 in place. A lens 208 is disposed above semiconductor wafer 210. Lens 208 typically comprises a demagnification lens that reduces the image transferred to the semiconductor wafer 210 by 4 to 5 times, for example. While lens 208 is depicted in the figure as a single lens, lens 208 will in most cases include a system of lenses. Alternatively, no lens 208 may be required if a 1:1 ratio magnification scheme is used for transferring the pattern from the mask 206 to the semiconductor wafer 210. A mask 206, having the desired pattern to be transferred to semiconductor wafer 210, is disposed above lens 208. A light or energy source 204 is disposed above mask 206, as shown.

To pattern semiconductor wafer 210, light source 204, which may comprise a laser or ultraviolet light, for example, is illuminated. The light passes through mask 206 and through lens 208 exposes portions of photoresist on the top surface of wafer 210.

In a preferred embodiment of the present invention, mask and exposure techniques are used to modify the patterns on mask 206, and thereby improve the integrity of the exposed images on wafer 210. In a conventional integrated circuit lithography system, an ideal mask pattern using a given mask technique is designed for a given integrated circuit layout using a single exposure setting optimized to fit all pattern densities on a given mask.

Referring to FIG. 3a, an exemplary target pattern 300 is shown. The pattern includes elements 314 representing non-exposed areas on the wafer and spaces 304 representing exposed areas on the wafer. In a preferred embodiment of the present invention, positive resist is used so that regions of resist exposed to light are cleared from the wafer prior to processing leaving non-exposed regions of resist on the wafer. In an alternative embodiment of the present invention, however, negative resist can be used, so that non-exposed regions are cleared from the wafer prior to processing leaving exposed regions of resist on the wafer. It should be noted that techniques used for positive resist embodiments can also be applied to negative resist embodiments.

In FIG. 3a, the target pattern 300 represents three regions of critical distance density: high density regions 306, intermediate density regions 308, and low density regions 310. In high density region 306, exposed spaces 351 and 352 of a critical dimension are separated by a non-exposed region 354 of a critical dimension. Adequate exposure of the resist to these high density patterns requires the most aggressive illumination.

Another source of density dependent error is related to the particular image contrast of a given region. Image contrast is related to pattern density, and defined as the difference between the maximum and minimum intensities in an image divided by their sum. Low contrast regions, in particular, are prone to a higher mask error enhancement factor (MEEF), which is defined as the ratio of the amount of dimensional change in a resist feature caused by a known change in corresponding mask feature to the known change in mask feature normalized to wafer dimensions. In other words, regions of different densities and contrasts will be prone to differing susceptibilities to pattern error. These contrast dependent pattern errors can also exacerbate errors caused by sub-optimal illumination. In particular, intermediate density areas are problematic because their lower image contrast makes them more prone to pattern error, yet their pattern density is high enough for an illumination dependent pattern error to cause a serious device failure.

In intermediate density region 308, exposed spaces 356 and 358 of a critical dimension are separated by a non-exposed region 360 of an intermediate dimension. This region requires a less aggressive illumination scheme than the high density region 306. Intermediate dimensions are typically between about 1.2 to about 2.5 times the critical dimension. The boundary between what is considered high density region 306 and intermediate density region 308 can vary depending on the process, and my fall outside of the stated 1.2 to 2.5 times range in some cases. If intermediate density region 308 is exposed using the same exposure settings as the high density region 306, however, the process window for said intermediate features will be much smaller and may cause catastrophic failures such as bridging, where lines open up causing unwanted open circuits.

In low density region 310, exposed spaces 362 and 364 of a critical dimension are separated by a non-exposed region 366 of a longer dimension which is typically 2.5 times the critical dimension or greater. Low density region 310 is less sensitive to the exposure settings because other options of supporting and enabling a wider process window become available, such as the introduction of non-printing sub-resolution assist features (SRAFs).

In a fine geometry process with small critical dimensions, for example 45 nm or smaller, it may be impossible to expose high density region 306 and intermediate density region 308 using the same exposure settings. In a preferred embodiment of the present invention, target pattern 300 is decomposed into a plurality of masks according to a mask decomposition algorithm. The mask decomposition algorithm is formulated so that each mask does not contain intermediate density regions 308. When the resist is successively exposed using each mask and subsequently processed, the target pattern is accurately etched in the resist.

Figure 3B:
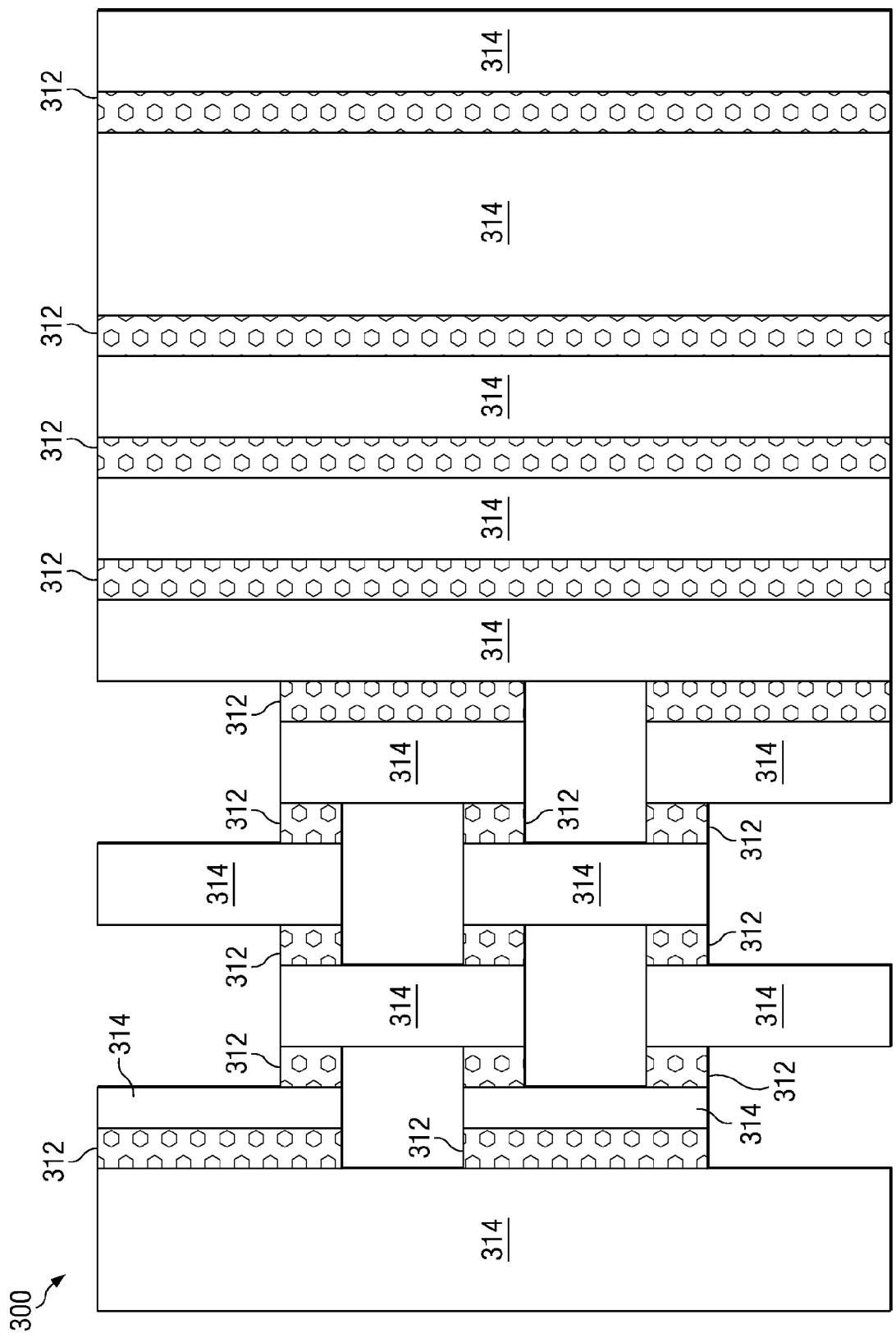

Turning to FIG. 3b, the first step of the decomposition process, the identification of all critical spaces 312 between mask elements 314, is shown. Critical spaces 312 are spaces having at least one dimension being a critical dimension. The identification of these spaces is preferably performed by a computer using an electronic representation of the mask layer, although in alternate embodiments, other methods may be used.

Figure 3C:
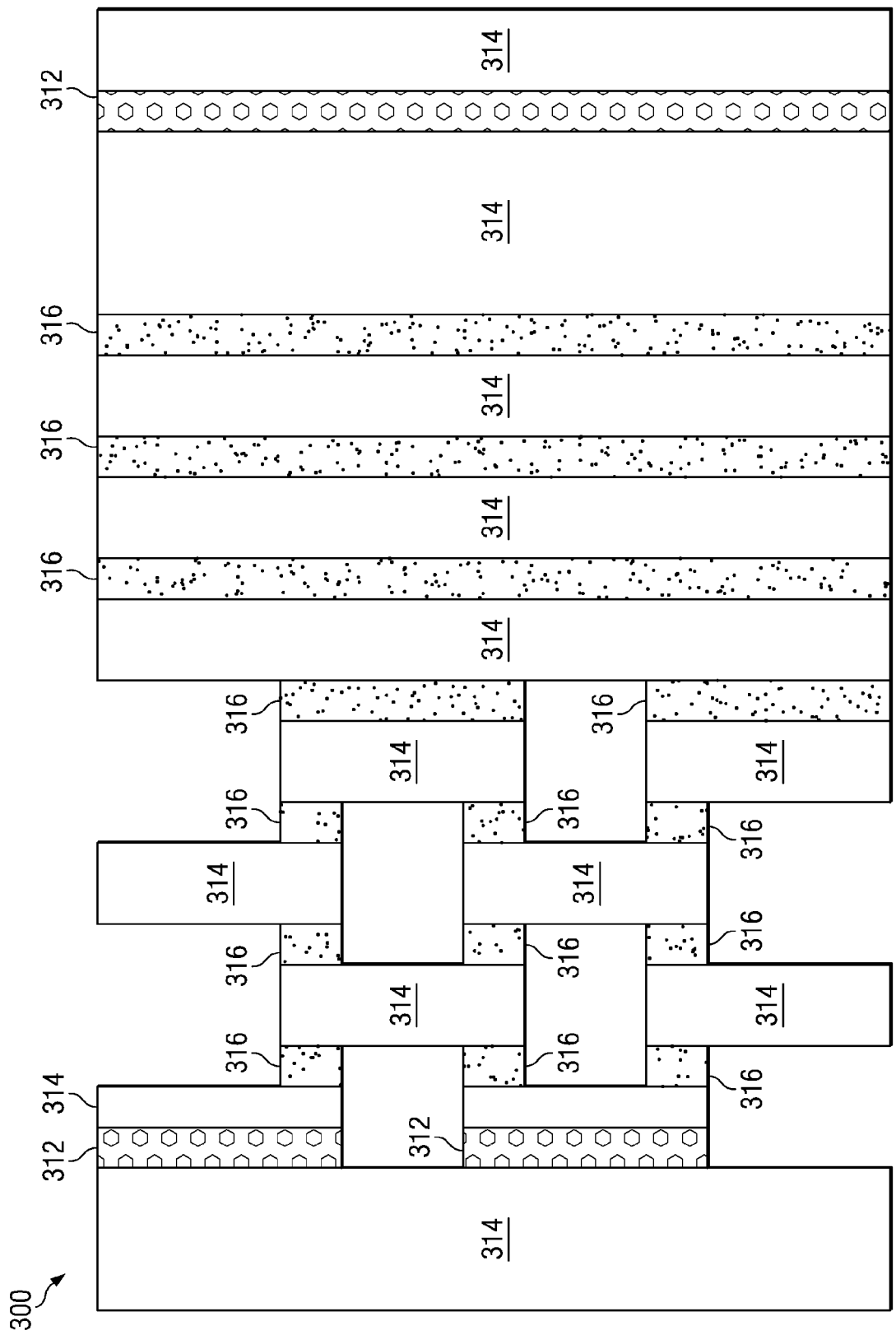

Next, as shown in FIG. 3c, critical spaces 312 separated from an adjacent critical space 312 by an intermediate distance on at least one side are identified and designated as intermediate critical spaces 316.

Figure 3D:
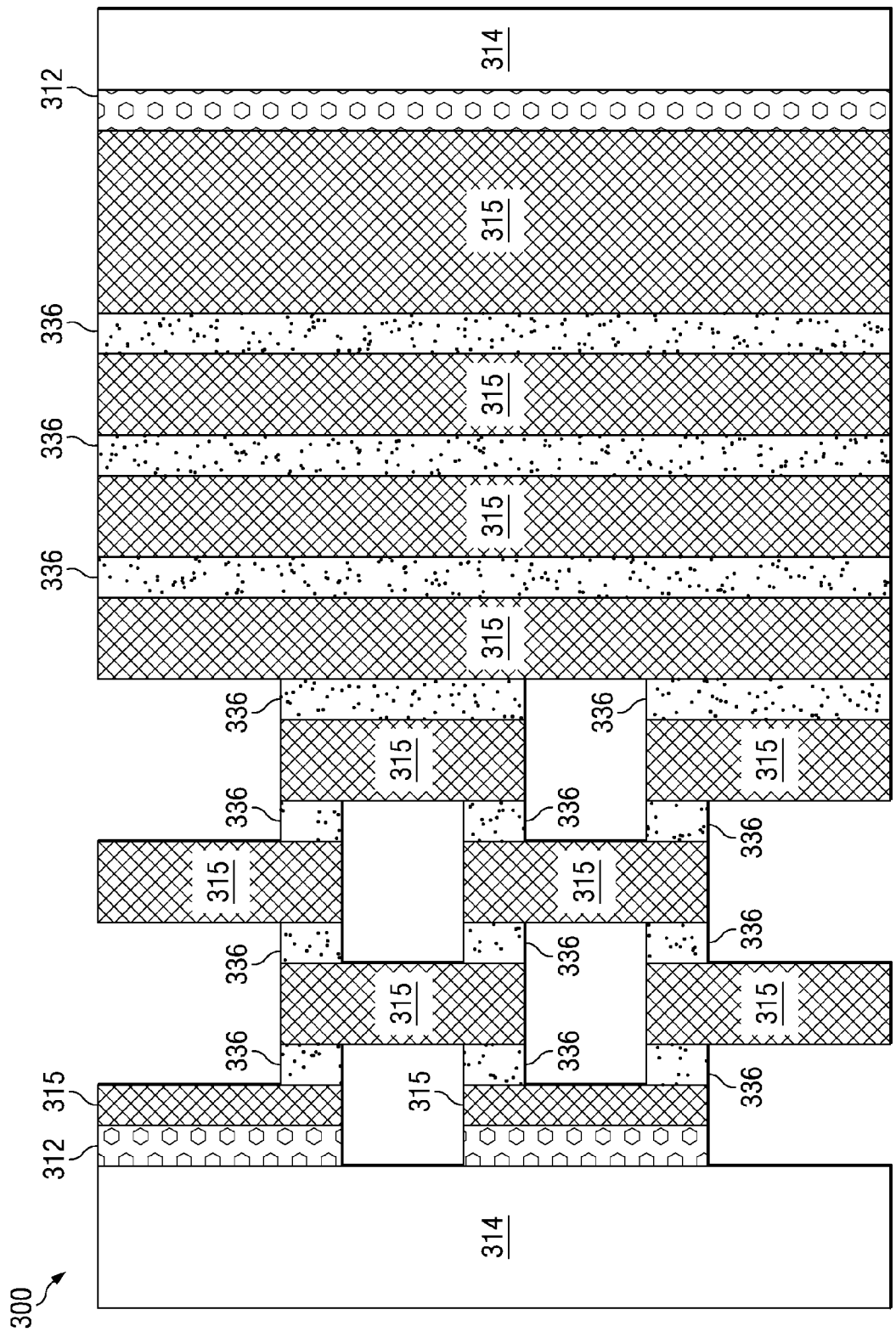

Turning to FIG. 3d, adjacent critical spaces 312 and mask elements 314 which border adjacent critical spaces 312 in target pattern 300, are inverted in a preferred embodiment of the present invention. Adjacent critical spaces 316 are mapped into opaque elements 336, and mask elements 314 immediately adjacent to intermediate critical spaces 316 (FIG. 3c) are mapped into transparent spaces 315.

Figure 3E:
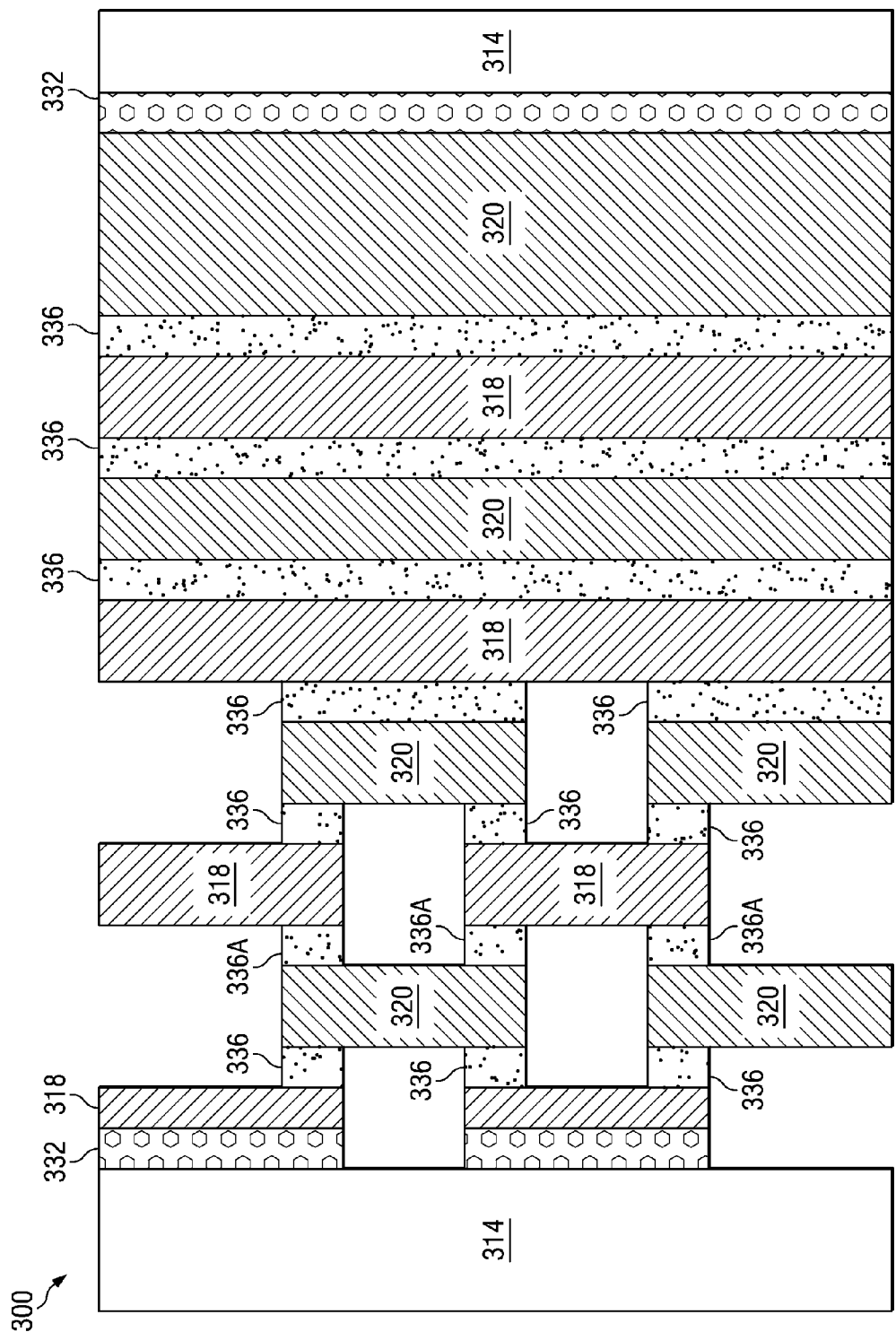

As shown in FIG. 3e, according to a preferred embodiment of the present invention, alternating phase shift mask (altPSM) coloring is applied to transparent spaces 315 (FIG. 3d), so that transparent space 315 (FIG. 3d) is transformed into transparent openings 318 and 320 in an alternating manner. Normally, altPSM is a resolution enhancement method using specific types of masks. As shown in FIG. 3d, the alternating phase shift mask includes two alternating phase mask transparent openings, 318 and 320, which pass light. The remaining part of the mask is opaque. The first transparent opening 318 passes light, and the second transparent opening 320 passes light 180° out of phase with the light passed through first transparent opening 318. If a mask made according to target pattern 300 was exposed to a light source, the phase shifted light passing transparent openings 318 and 320 would define the critical dimension of transformed opaque elements 336. In alternative embodiments of the present invention that do not utilize altPSM, intermediate critical spaces 316 (FIG. 3c) can be designated instead as alternating odd intermediate critical mask elements and even intermediate critical spaces. Once the odd and even intermediate spaces are identified, mask decomposition would continue as described herein below.

In a preferred embodiment of the present invention, target pattern 300 is mapped into an altPSM representation because altPSM design tools, algorithms, and software such as phase coloring and checking programs are readily available. Existing altPSM design tools are preferable because these tools already perform the mapping and design checking functions required by embodiments of the present invention. In an alternative embodiment of the present invention, other techniques could be used besides transforming the design into an altPSM representation. For example, dedicated software could be developed to decompose the mask.

After the transformation into an altPSM representation, a phase compliance check is performed using the altPSM design software. This design rule check is performed to make sure that a valid altPSM phase decomposition is performed. In preferred embodiments of the present invention, however, the compliance check can be modified to relax certain phase compliance rules which do not interfere with performing a valid mask decomposition for the purposes of embodiments of the invention disclosed herein. These rule modifications are described below.

Figure 3F:
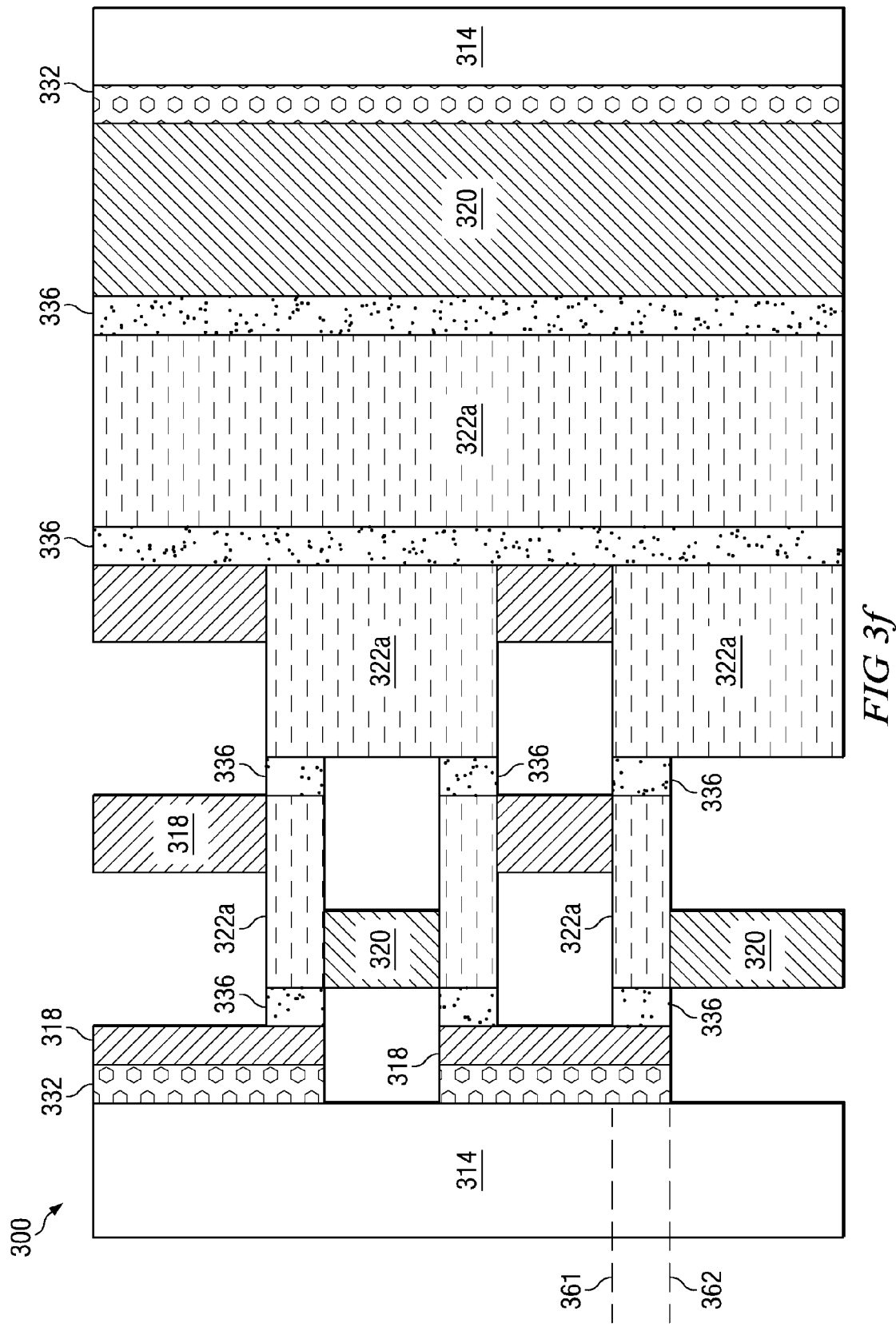

Turning to FIG. 3f, the first step in the formation of the first decomposed mask, according to a preferred embodiment of the present invention, is shown. In the diagram first mask regions 322a are identified as extending from the left edge of transparent space 320 extending rightward over opaque region 336 and over transparent space 318 to the left coincident edge of adjacent opaque region 336. The heights of these regions extend from the bottom boundary 362 of transformed opaque regions 336 to the top boundary 361 of opaque regions 336. These boundaries are derived from the height of regions 336A shown in FIG. 3e. These top and bottom boundaries 361 and 362 are also the top and bottom boundaries of the first mask regions 322a as they project over neighboring regions. It should be understood that the example shown in FIG. 3e is only shown in operation over one dimension. In other embodiments of the present invention, this process is performed in two dimensions.

Figure 3G:
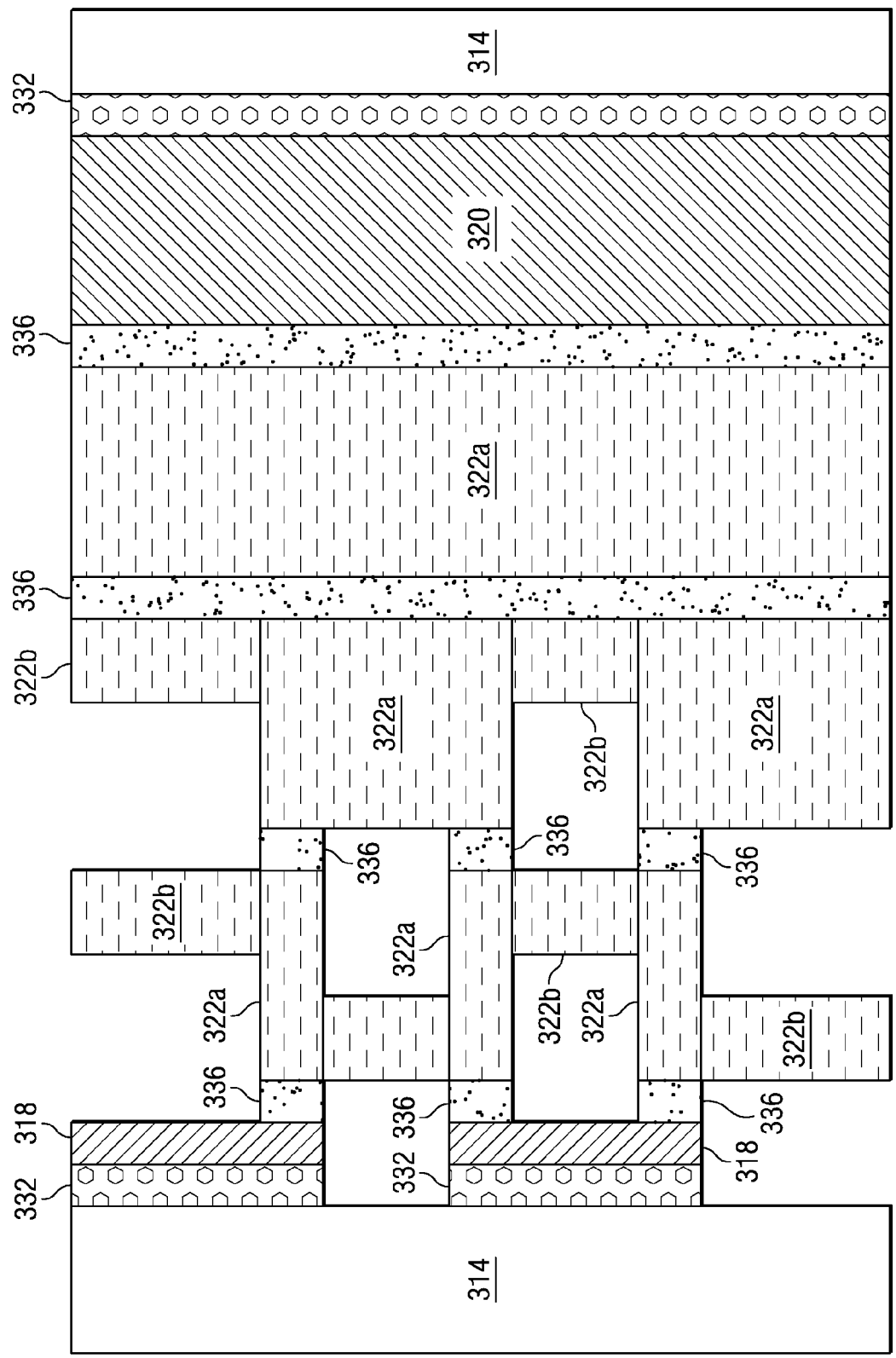

The next step in forming the first mask elements 332b is shown in FIG. 3g. Transparent spaces 318 and 320 that are touching first mask elements 322a are mapped into first mask elements 322b. At this point, one part of target pattern 300 is transformed from the altPSM representation back into its original representation. First mask elements 322a and 322b, transparent spaces 318 and 320, and regions 314 are transformed into opaque regions, and opaque regions 336 and 332 are transformed back into spaces.

Figure 3H:
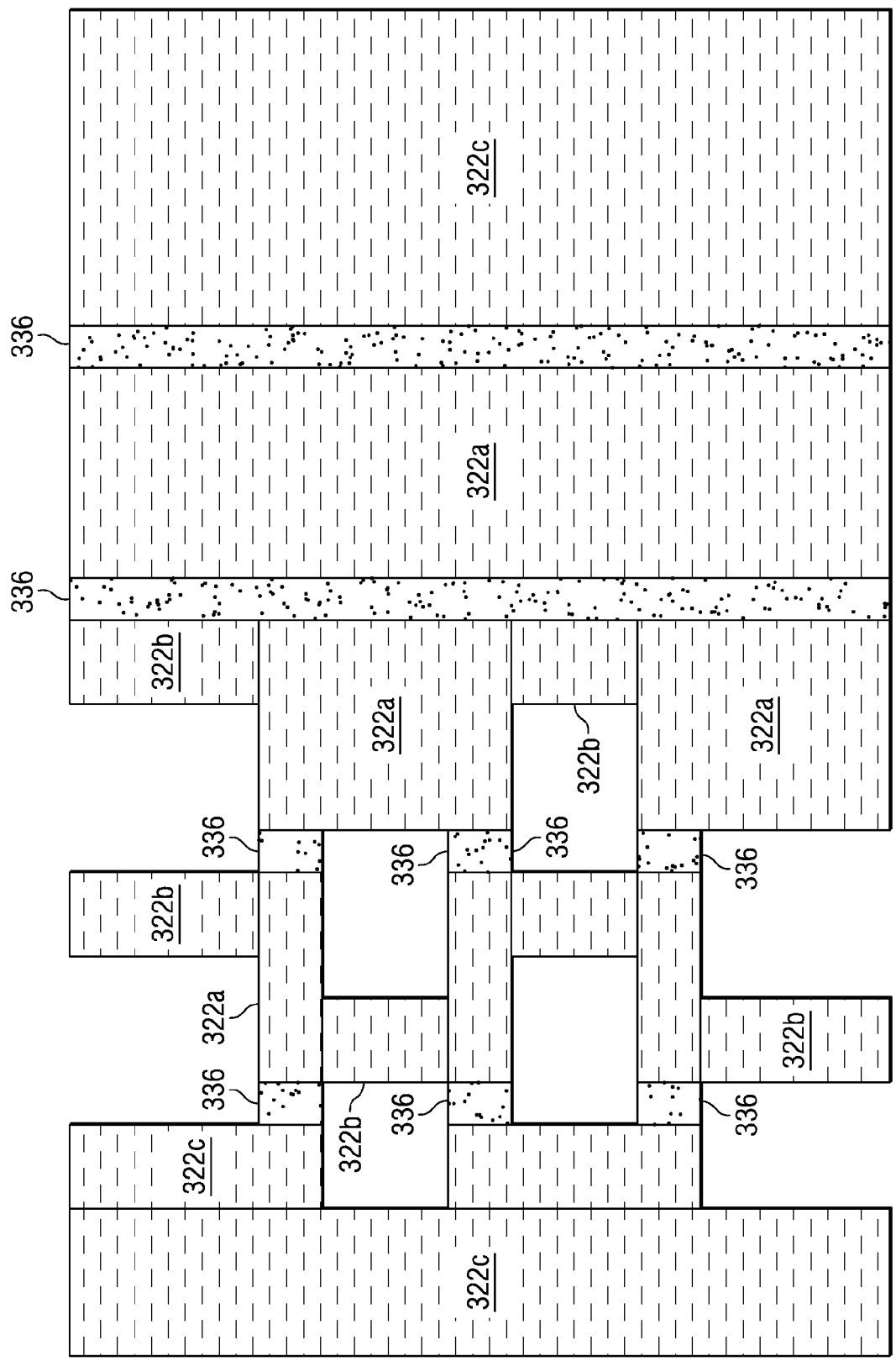
Figure 3I:
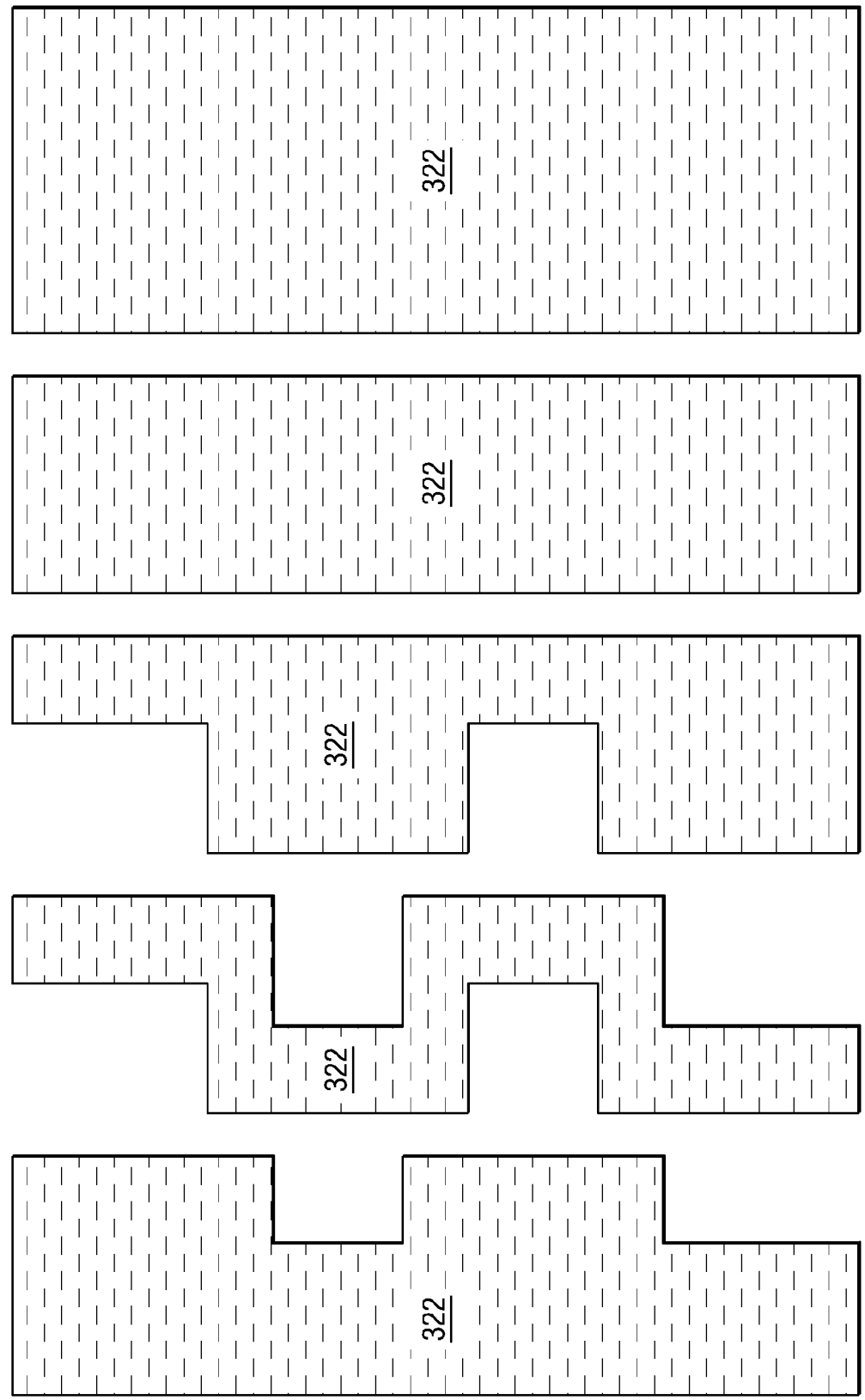

Turning to FIG. 3h, first mask elements 322c are then assigned from all remaining opaque elements 314, and transparent spaces 318, and 320 from FIG. 3f. FIG. 3i shows the first mask elements 322 of the decomposed mask set after the space identifiers have been stripped away.

Figure 3J:
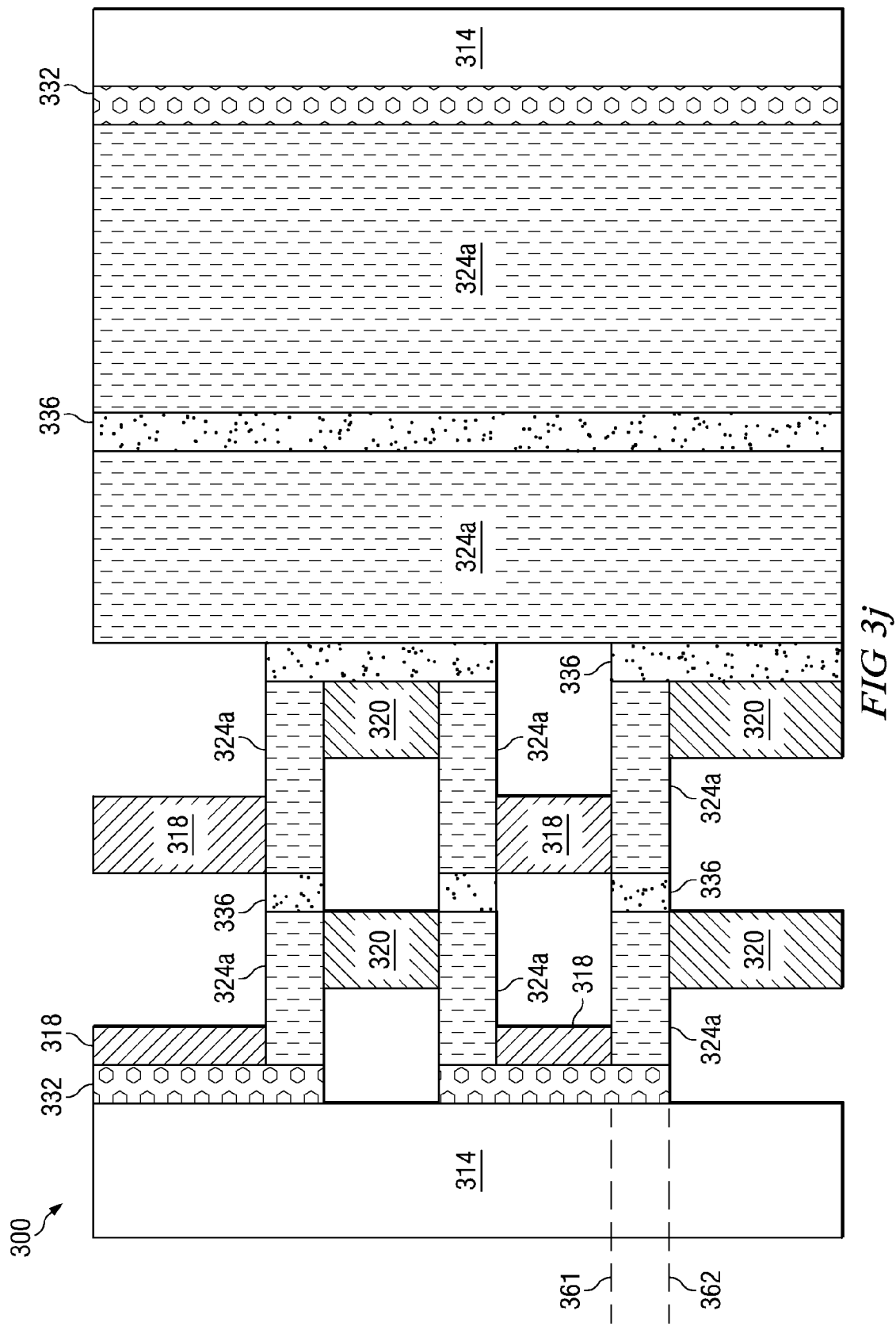

In FIG. 3j, the first step of the formation of the second mask is shown. Transformation from target pattern 300 to the second mask proceeds in a manner similar to the formation of the first mask as shown in FIGS. 3f-3h, except that second mask regions 324a are identified as extending from the left edge of transparent opening 318 (or the right edge of opaque region 332) extending rightward over opaque region 336 and over transparent opening 320 to the left coincident edge of adjacent opaque region 336. In other words, second mask regions 324a are shifted over by one opaque region 332 or 336 from the first mask. The height of these regions also extends from the bottom boundary 362 of opaque regions 336 to the top boundary 361 of opaque regions 336. These top and bottom boundaries 361 and 362 are also the top and bottom boundaries of the second mask regions 324a as they project over neighboring regions. The heights of these regions also correspond to the height of regions 336A shown in FIG. 3e.

Figure 3K:
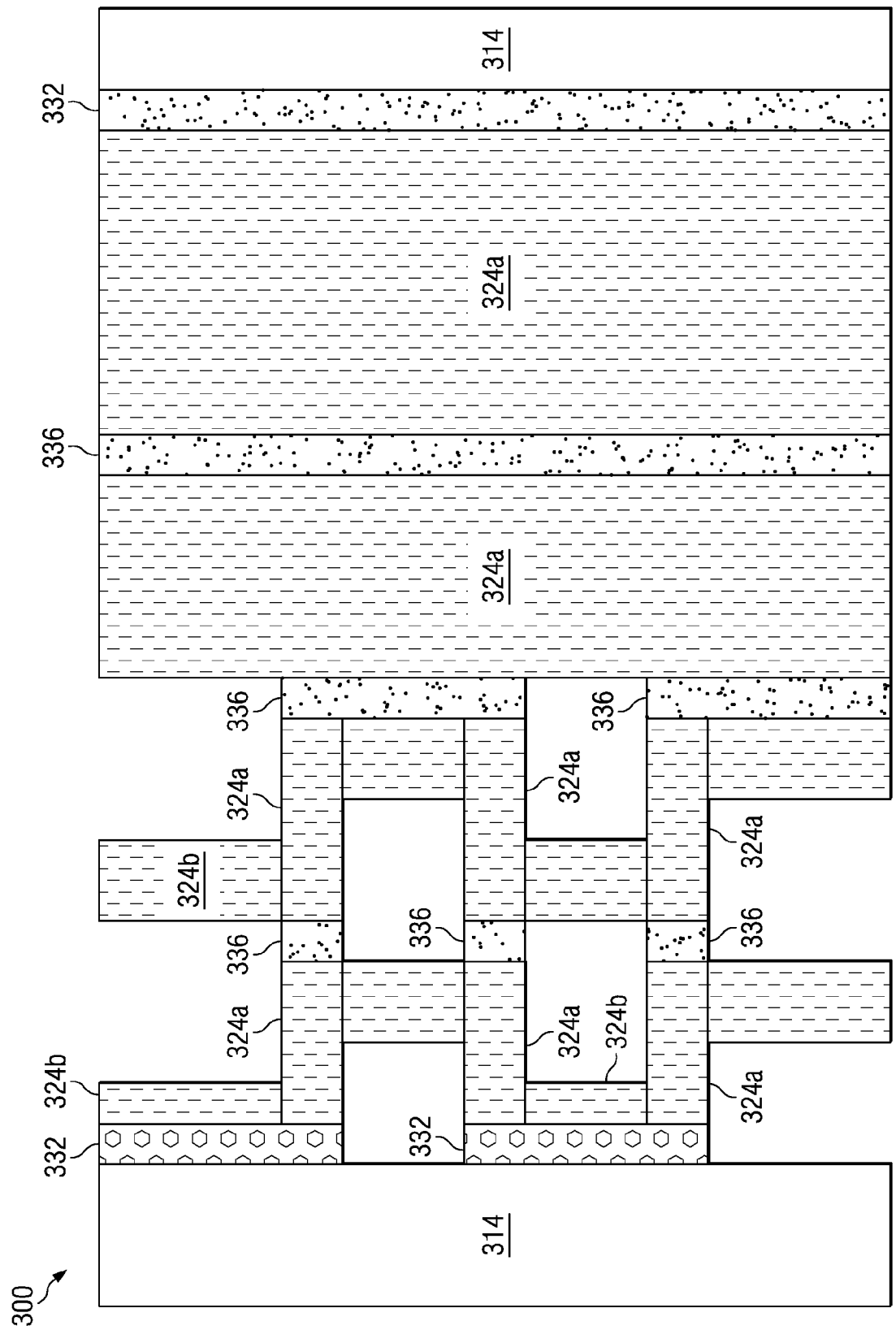

The next step in forming the second mask regions is shown in FIG. 3k. Transparent spaces 318 and 320 touching second mask regions 324a are transformed into second mask elements 324b. The remaining part of target pattern 300 is then transformed from the altPSM representation back into the original representation. As with the first mask, second mask elements 324, and transformed transparent spaces 318 and 320, and regions 314 are transformed into opaque regions, and opaque regions 336 and 332 are transformed back into spaces.

Figure 3L:
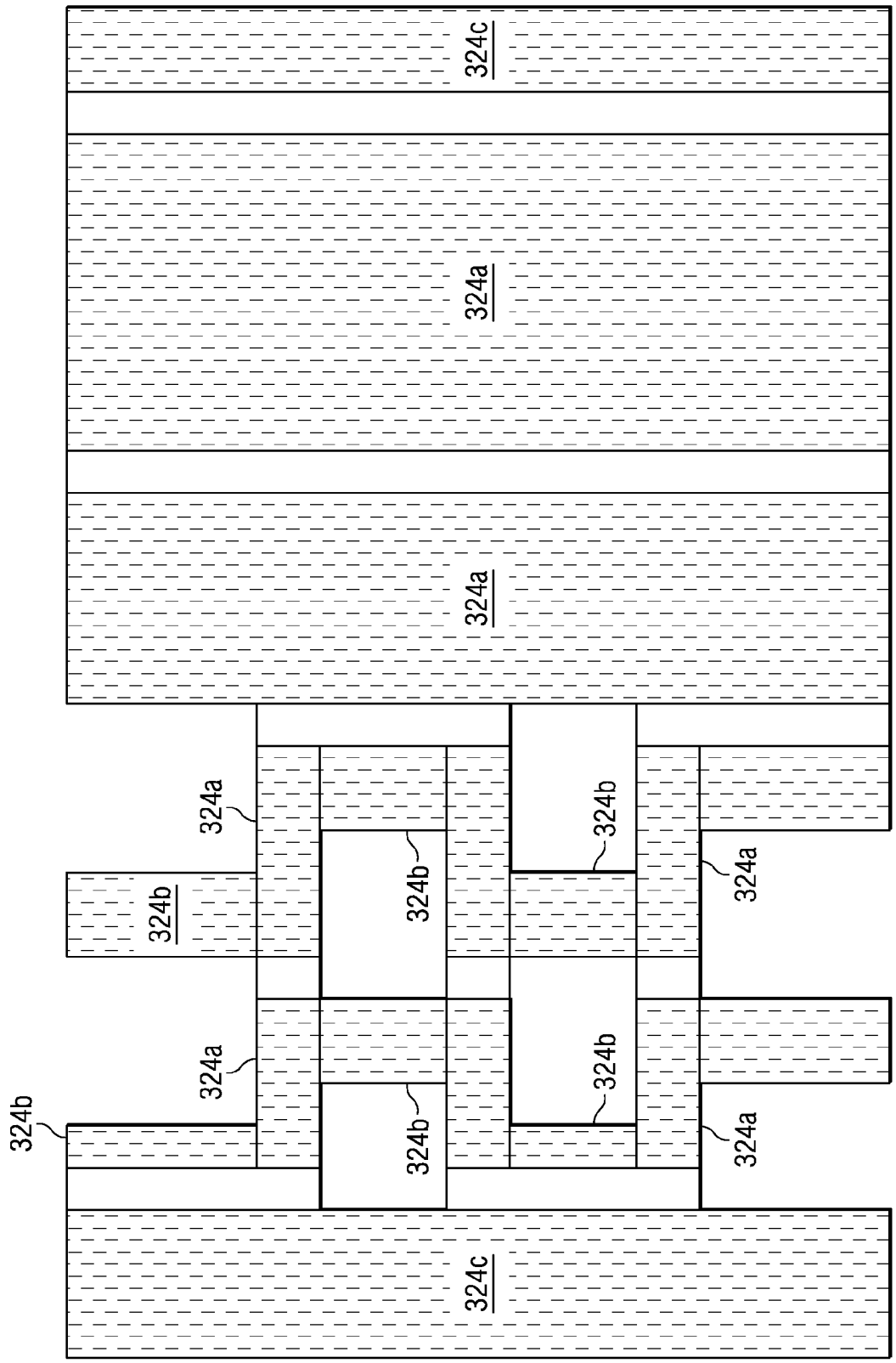
Figure 3M:
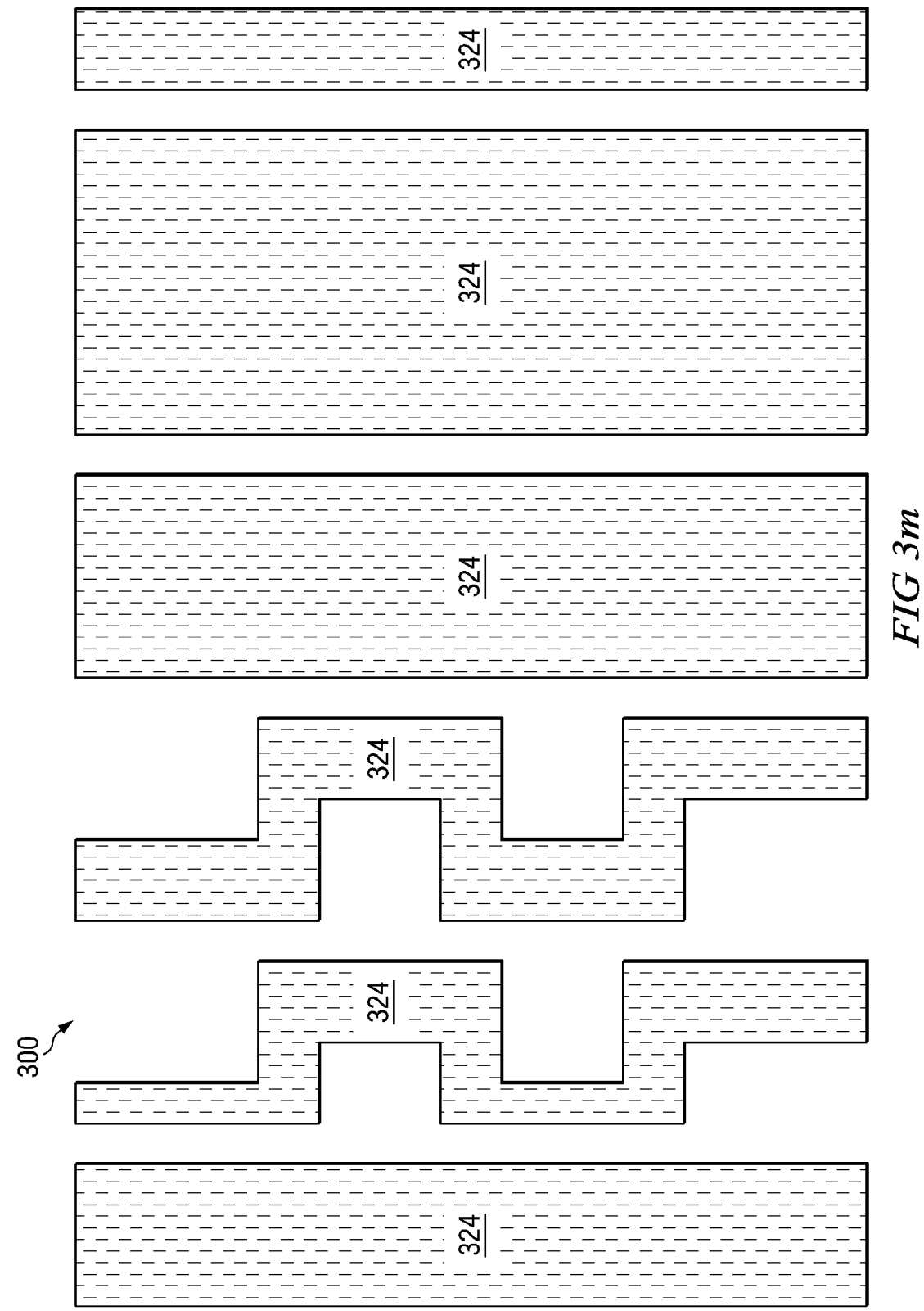

Turning to FIG. 3l, second mask elements 324c are assigned from all remaining opaque elements (314, 318, and 320 from FIG. 3k). FIG. 3m shows the second mask 324 of the decomposed mask set after the space identifiers have been stripped away.

Once the masks have been generated, the wafer can be exposed to the two masks using a multiple exposure technique. In a preferred embodiment of the present invention, two masks that are subsequently exposed into the same resist layer followed by a develop and etch step. Due to the nature of the optical transfer of the individual masks adding intensity into the resist, the final resist image after the two exposures is not the simple addition of the two exposures but there is some interaction going on due to the fact that some resist parts are only partially exposed by one mask with more partial exposure by the second mask. These interactions are dealt with using known techniques in the art. In other embodiments of the present invention, three or more masks may be used successively to expose the wafer.

In another preferred embodiment of the present invention, a multiple patterning technique may be used to expose the wafer to the masks. With the multiple patterning technique, two or more masks are exposed into different resist layers. For example a typical process sequence for a multiple patterning technique would include steps such as spin-on resist, expose the first mask, develop the first, etch the first mask, strip the resist, spin-on second resist, expose the second mask, develop the second mask, etch the second mask, and strip the resist. In other embodiments of the present invention, more than two patterning steps may be used.

One advantage of the embodiments of the present invention described herein is that by using commercially available altPSM tools and algorithms, mask decomposition can be performed automatically without resulting in intractable decomposition conflicts. Decomposition conflicts result when two exposed areas (or trenches in the resist) of a critical dimension that are separated from each other by an intermediate dimension end up on the same mask. AltPSM design checking, however, can find potential decomposition conflicts. If a design does not create detectable conflicts during altPSM checking, successful decomposition into two masks can be assured. In instances where a design fails an altPSM design check, successful decomposition may still be possible. In fact, design checking by the altPSM tool can be relaxed, as described herein below, while decomposing masks according to embodiments of the present invention.

FIG. 4a contains a layout view of a target mask design 400 after transformation into an altPSM representation. The transformed target mask design 400 contains transformed opaque spaces 408 and transformed transparent spaces 402 and 404 of opposite phases from each other. The geometry of this design, however, is such that a phase conflict 406 occurs where two regions of opposite phases transparent space 402 and transparent space 404 abut each other. According to a preferred embodiment of the present invention, phase conflict 406 may be ignored and/or the reporting of phase conflict 406 can be disabled while performing conflict checking on the transformed and phase colored target mask design 400.

Figure 4B:
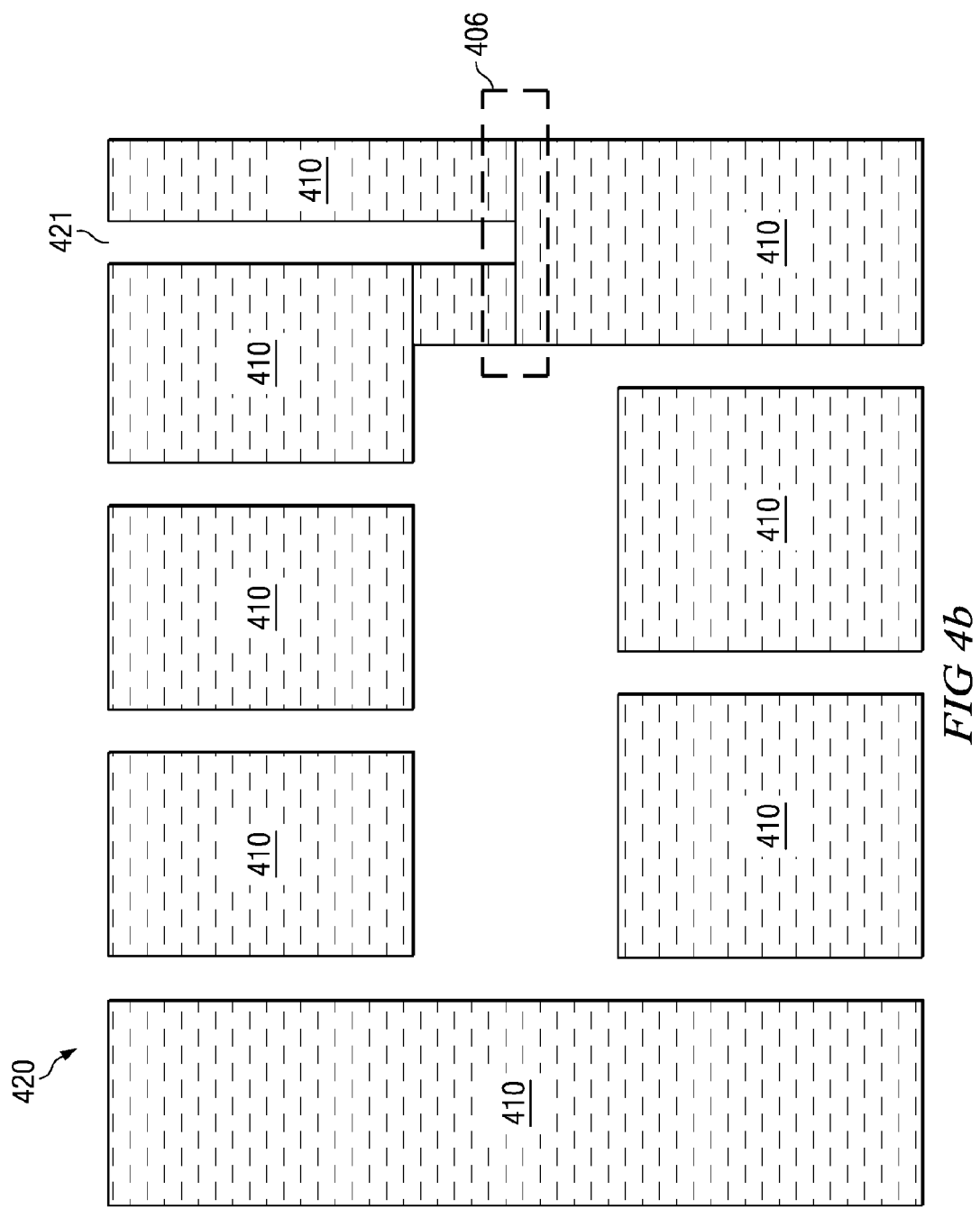
Figure 4C:
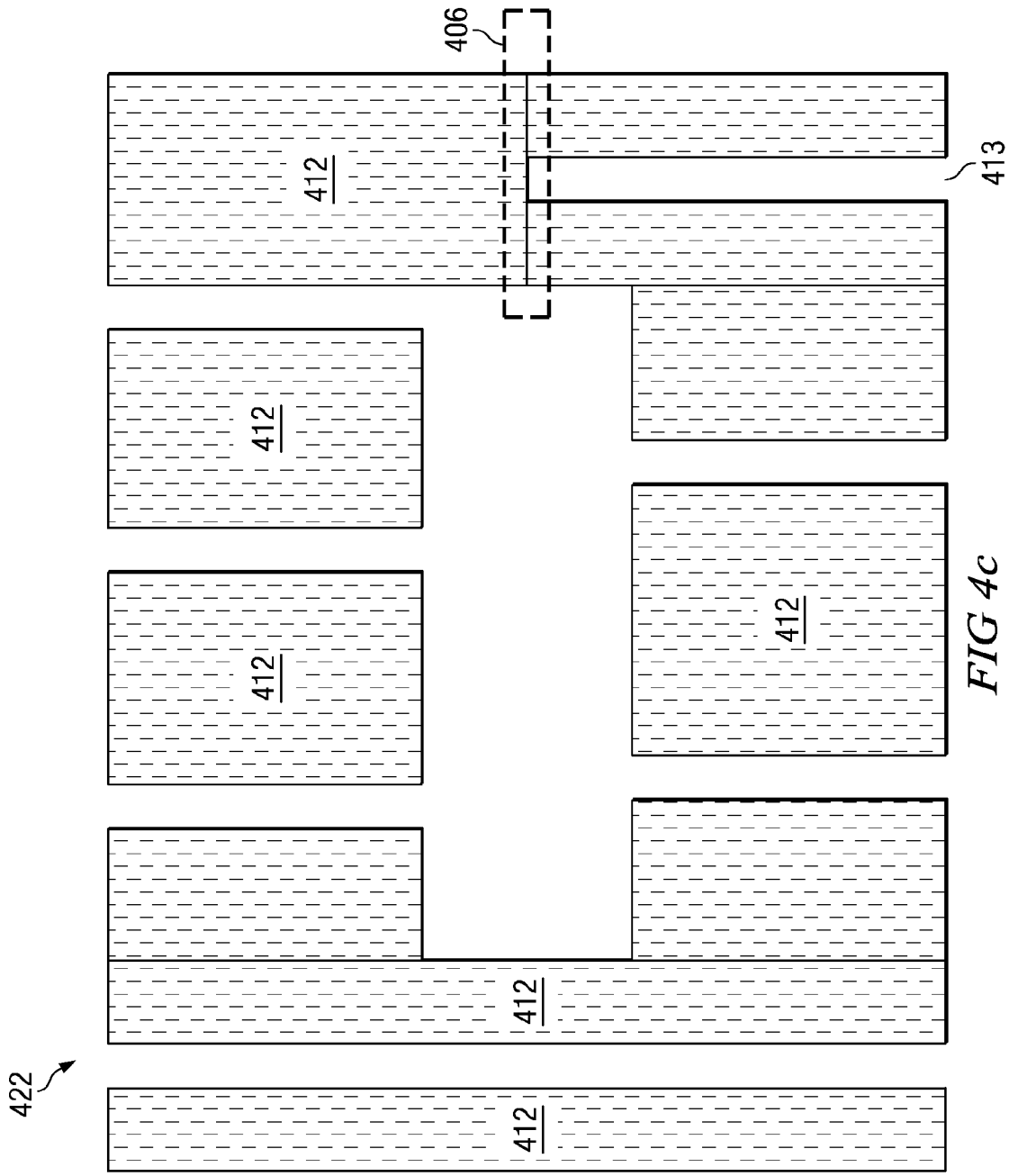

In FIG. 4b, the first mask 420 with mask elements 410 is derived from target mask design 400 shown in FIG. 4a. FIG. 4c shows the second mask 422 consisting of mask elements 412 derived from target mask design 400. As shown by the FIGS. 4b and 4c, space 421 in the first mask 420 (FIG. 4b) and space 423 in the second mask 422 (FIG. 4c) abut each other. Once the resist is exposed to these masks successively, space 421 and space 423 will merge and become one contiguous space (or trench) in the resist if a multiple exposure technique is used. If a multiple patterning technique is used, the resultant pattern on the wafer will reflect a contiguous region specified by spaces 421 and 423. In a preferred embodiment of the present invention, however, edges of spaces 421 and 423 can be extended slightly so that the two spaces overlap to ensure that a thin line is not printed at the interface between the spaces. The amount of overlap is typically between about 30 nm and about 70 nm, preferably about 50 nm; however the amount of overlap can vary according to the process used. Therefore, in preferred embodiments of the present invention, altPSM conflict checks for contiguous opposite phase regions can be disabled.

Figure 5A:
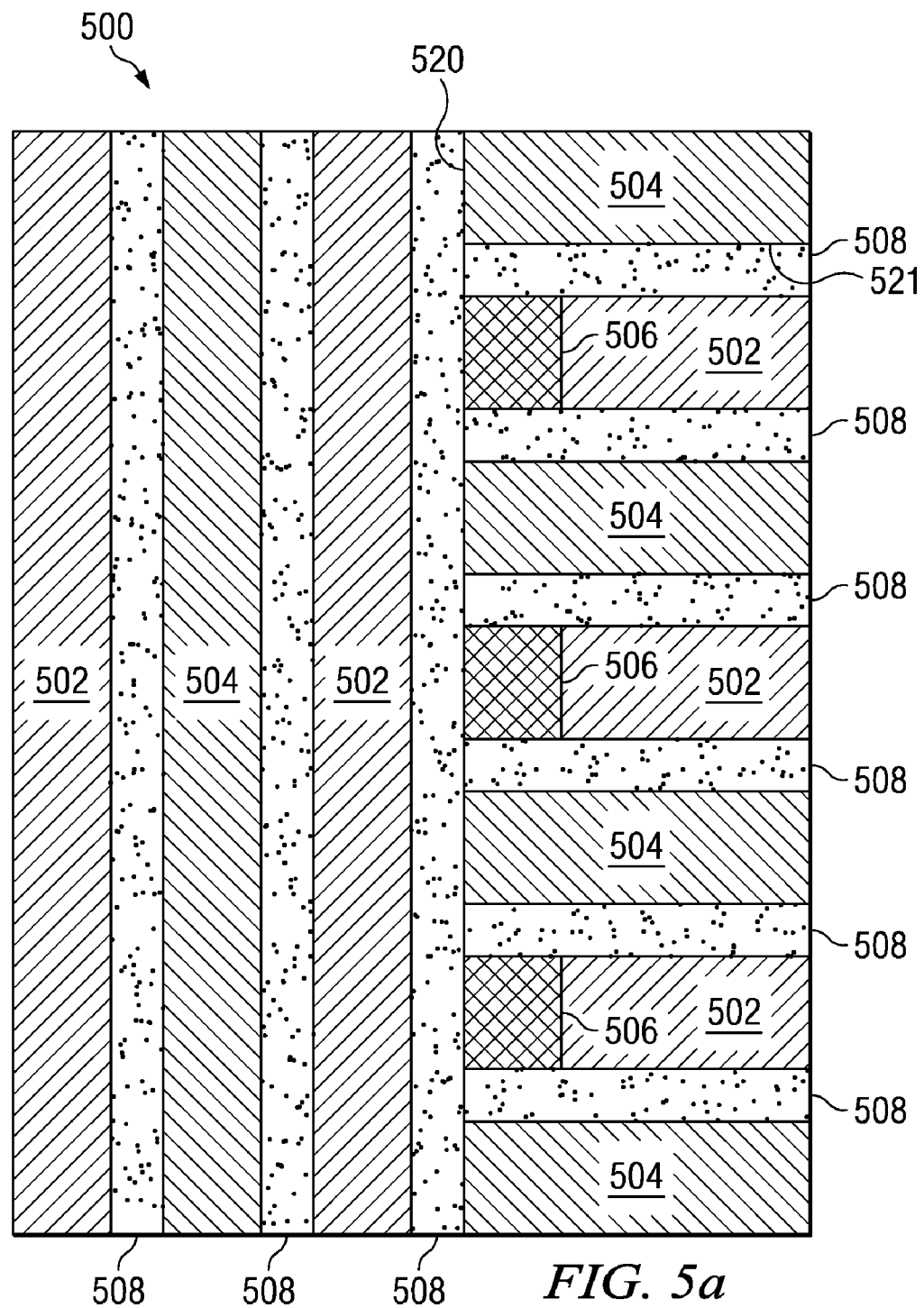
FIGS. 5a-5c illustrate another embodiment for decomposing a mask set.
Figure 5B:
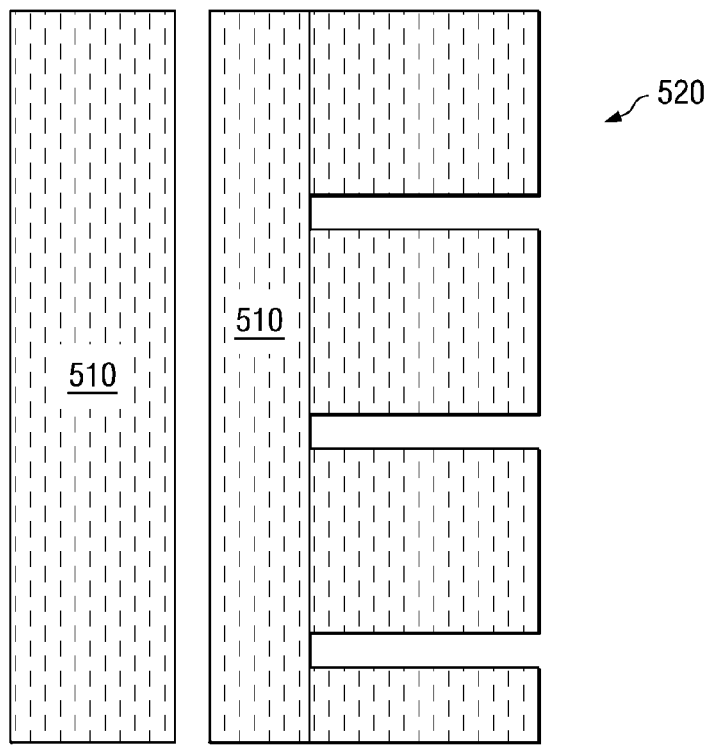
Figure 5C:
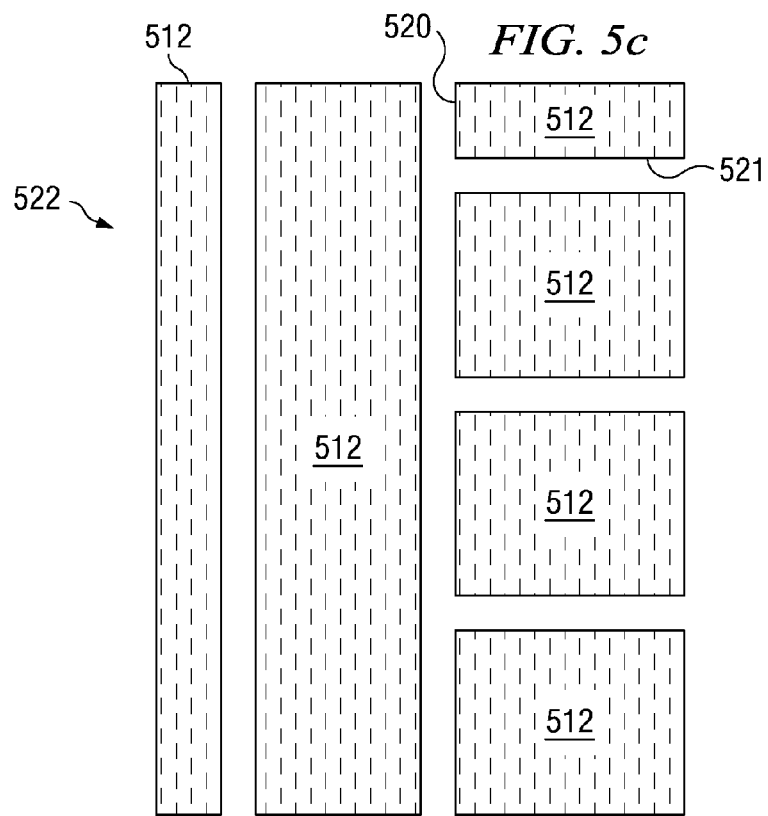

FIG. 5a shows a layout view of a target mask design 500 after transformation into an altPSM representation. The transformed target mask design 500 contains transformed opaque spaces 508 and transformed transparent spaces 502 and 504 which are of opposite phase from each other. The geometry of the design, however, creates a conflict 506 where two regions of opposite phase overlap each other. According to a preferred embodiment of the present invention, these phase conflicts 506 are resolved by removing one of the conflicting regions of opposite phase, or by leaving the conflict in place and merging opaque regions during subsequent mask decomposition steps. The resulting decomposed mask elements are shown in FIGS. 5b and 5c. FIG. 5b shows the first decomposed mask 520 composed of mask elements 510, and FIG. 5c shows the second decomposed mask 522 composed of mask elements 512.

Figure 6:
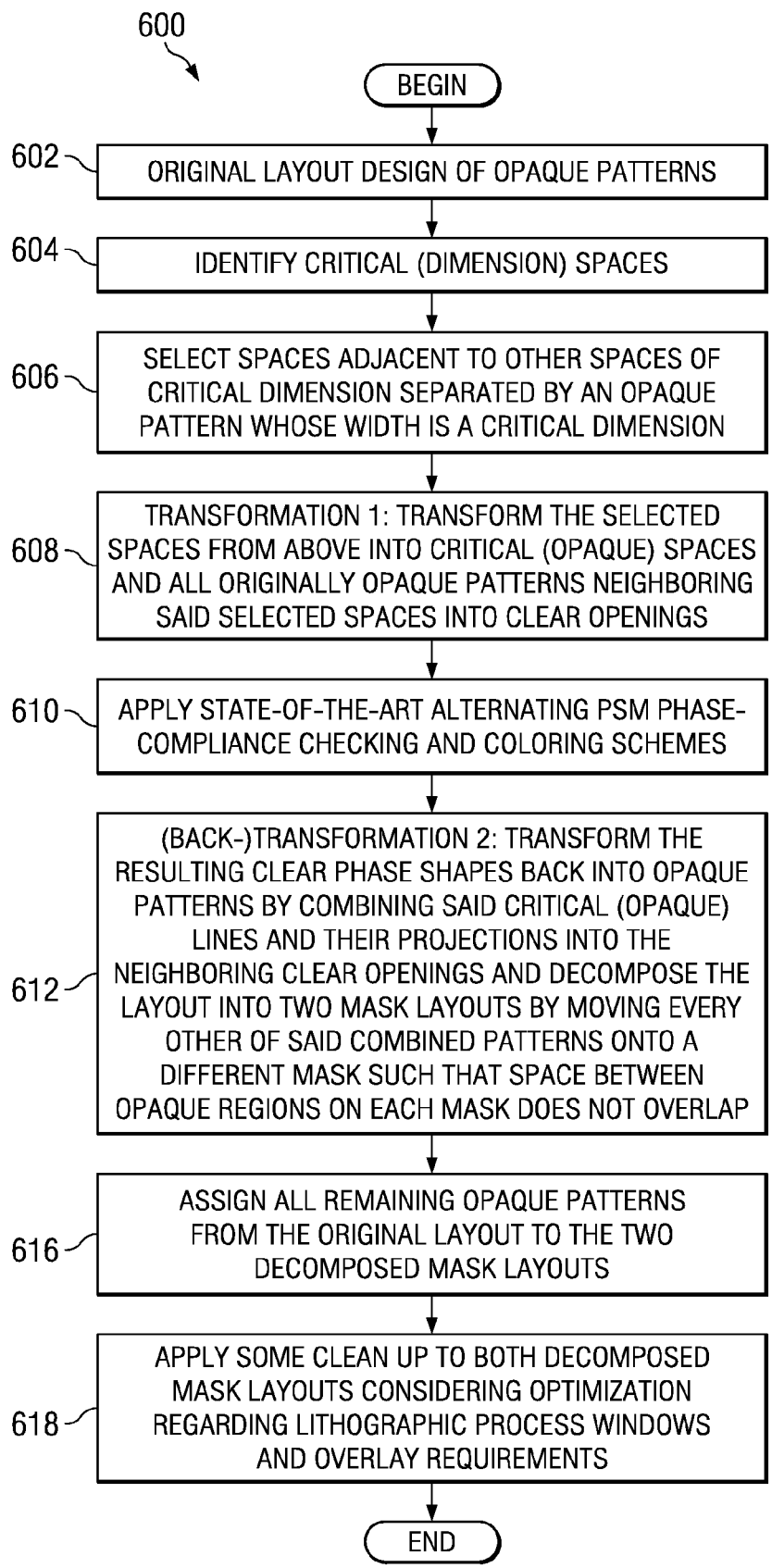
FIG. 6 is a flow chart describing an embodiment method for decomposing a mask set.

Turning to FIG. 6, a flowchart showing the method of a preferred embodiment of the present invention is illustrated. Each of these process steps are preferably performed on a computer using software, although other means of performing these steps could be used. Typically these steps are performed prior to and in preparation for mask fabrication. In alternative embodiments of the present invention, however, these steps could be performed in other circumstances, for example, during process development or during the design phase of a product.

First, in step 602, a layout design of opaque patterns for a particular mask is provided. This layout design is preferably in a computer readable format such as GDSII, CIF, GL1, or Oasis.

Next, in step 604, spaces of critical dimension are identified as described herein above. In a preferred embodiment of the present invention, a computer search is performed to identify these spaces. Then, in step 606, spaces of critical dimension adjacent to other spaces of critical dimension separated by an opaque element whose width is a lithographic critical dimension are selected.

In step 608, a first transformation is performed. Identified spaces are transformed into opaque spaces, and opaque areas/patterns neighboring identified spaces are transformed into clear openings of alternating phase using an altPSM representation. In a preferred embodiment of the present invention, this step is preferably performed using state of the art altPSM software and algorithms such as Mentor Calibre™. Once the design has been transformed into an altPSM representation, altPSM phase compliance checking is performed using commercially available altPSM checking software in step 610. In alternative embodiments, other techniques and representations can be used. For example, custom software could be developed to decompose the mask pattern without converting the mask pattern to an altPSM representation.

After the design has been transformed and verified, the design is decomposed into two masks and transformed back into a representation where spaces correspond to clear openings on the mask. In step 612, transformed clear openings and their projections into transformed adjacent spaces are transformed back into opaque segments on two separate decomposed masks, where each decomposed mask contains every other transformed clear opening and their associated projections, according to the techniques described hereinabove.

In step 616, all remaining transformed clear openings are transformed into opaque patterns and then merged with the projected clear openings, as described herein above with respect to FIGS. 3a-3m. Lastly, in step 618 each decomposed mask layout undergoes optimization and clean-up.

It will also be readily understood by those skilled in the art that materials and methods may be varied while remaining within the scope of the present invention. It is also appreciated that the present invention provides many applicable inventive concepts other than the specific contexts used to illustrate preferred embodiments. Specifically, the use of a "correct-negative" process rather than the described "correct positive" process is understood. Accordingly, the appended claims are intended to include within their scope such processes, machines, manufacture, compositions of matter, means, methods, or steps.

What is claimed is:

1. A method for generating mask patterns, the method comprising:
    transforming a target lithographic pattern into a transformed lithographic pattern, wherein the target lithographic pattern comprises a plurality of mask elements, regions between the plurality of mask elements comprise spaces, and transforming comprises
        identifying critical spaces from the target lithographic pattern, wherein the critical spaces comprise spaces that comprise at least one dimension measuring a critical distance;
        identifying intermediate critical spaces, wherein the intermediate critical spaces comprise critical spaces which are separated from an adjoining critical space by an intermediate dimension;
        identifying intermediate mask elements, wherein the intermediate mask elements comprise mask elements immediately adjacent to at least one critical space; and
        identifying odd and even intermediate mask elements, wherein odd intermediate mask elements comprise every other intermediate mask element along an axis, and wherein even intermediate mask elements comprise remaining intermediate mask elements not designated as odd intermediate mask elements; and
    decomposing the transformed lithographic pattern into a first decomposed pattern and into a second decomposed pattern, wherein transforming and decomposing is performed by a computer having a non-transitory computer-readable storage medium with an executable program stored thereon.

2. The method of claim 1, wherein decomposing the transformed lithographic pattern into a first decomposed pattern and into a second decomposed pattern further comprises:
    forming a first mask pattern comprising, the forming comprising mapping
        the even intermediate mask elements,
        the odd intermediate mask elements,
        intermediate critical spaces immediately to the right of the even intermediate mask elements,
        mask elements not designated as critical mask elements,
        critical spaces not designated as intermediate critical spaces into a first mask pattern; and
    forming a second mask pattern, the forming comprising mapping
        the even intermediate mask elements,
        the odd intermediate mask elements,
        intermediate critical spaces immediately to the right of the odd intermediate mask elements,
        mask elements not designated as critical mask elements, and
        critical spaces not designated as intermediate critical spaces into a second mask pattern.

3. The method of claim 1, wherein the executable program comprises dedicated software written to perform the transforming and the decomposing.

4. The method of claim 1, wherein the plurality of mask elements are transformed into opaque regions, and wherein the transformed lithographic pattern is printed onto a semiconductor wafer as a pattern in a positive photoresist.

5. The method of claim 1, wherein the plurality of mask elements are transformed into transparent regions, and wherein the transformed lithographic pattern is printed onto a semiconductor wafer as a pattern in a negative photoresist.

6. The method of claim 1, wherein the plurality of mask elements are transformed into transparent regions, and wherein the transformed lithographic pattern is printed onto a semiconductor wafer as a pattern in a negative photoresist.

7. A method for generating mask patterns, the method comprising:
    transforming the target lithographic pattern into a transformed lithographic pattern, the target lithographic pattern comprising a plurality of mask elements, wherein regions between the plurality of mask elements comprise spaces;
    decomposing the transformed lithographic pattern into a first decomposed pattern and into a second decomposed pattern, wherein transforming and decomposing is performed by a computer having a non-transitory computer-readable storage medium with an executable program stored thereon;
    identifying critical spaces from the target lithographic pattern, wherein the critical spaces comprise spaces that comprise at least one dimension measuring a critical distance;
    identifying intermediate critical spaces, wherein the intermediate critical spaces comprise critical spaces which are separated from an adjoining critical space by an intermediate dimension; and
    identifying intermediate mask elements, wherein the intermediate mask elements comprise mask elements immediately adjacent to at least one critical space.

8. The method of claim 7, further comprising:
    mapping the intermediate mask elements into openings;
    mapping the intermediate critical spaces into transformed mask elements; and
    applying altPSM coloring to openings, wherein the openings are mapped into odd openings and even openings.

9. The method of claim 8, wherein the decomposing comprises:
forming a first pattern, the forming comprising mapping odd openings, even openings, and transformed mask elements to the right of even openings, critical spaces not designated as intermediate critical spaces, and mask elements not designated as intermediate mask elements into a first mask; and
forming a second pattern, the forming comprising mapping odd openings, even openings, and transformed mask elements to the right of odd openings, critical spaces not designated as intermediate critical spaces, and mask elements not designated as intermediate mask elements into a second mask.

10. The method of claim 8, wherein the decomposing comprises:
forming a first pattern, the forming comprising mapping odd openings, even openings, and a projection from a rightward boundary of an even opening across to a leftward boundary of an odd opening, critical spaces not designated as intermediate critical spaces, and mask elements not designated as intermediate mask elements into a first mask; and
forming a second pattern, the forming comprising mapping odd openings, even openings, and a projection from the rightward boundary of an odd opening across to the leftward boundary of a even opening, critical spaces not designated as intermediate critical spaces, and mask elements not designated as intermediate mask elements into a second mask.

11. The method of claim 10, wherein the first pattern and the second pattern comprise mask elements.

12. The method of claim 8, wherein the applying the altPSM coloring comprises running dedicated altPSM mapping software.

13. The method of claim 8, further comprising performing an altPSM check after applying the altPSM coloring.

14. The method of claim 13, wherein the performing the altPSM check comprises running dedicated altPSM checking software, the dedicated altPSM checking software comprising a set of rules.

15. The method of claim 14, wherein a subset of the set of rules are disabled from checking.

16. The method of claim 15, wherein a rule preventing regions of opposite phases from abutting is disabled.

17. The method of claim 16, wherein the decomposing further comprises extending regions of opposite phases to create an overlap between the first mask and the second mask in regions where opposite phases abut.

18. The method of claim 17, wherein the overlap between the two masks comprises an overlap between about 30 nm and about 70 nm.

19. The method of claim 15, wherein a rule preventing regions of opposite phases from overlapping is disabled.

20. The method of claim 19, wherein a region of overlapping phases is transformed into a region of a single phase by removing a conflicting region of opposite phase.

21. The method of claim 7, further comprising optimizing the first decomposed pattern and the second decomposed pattern.

22. The method of claim 21, further comprising building a mask set utilizing the first decomposed pattern and the second decomposed pattern.

23. The method of claim 22, further comprising using the mask set to form a semiconductor device.

24. A method of generating a mask, the method comprising:
transforming a target lithographic pattern into a transformed lithographic pattern, wherein the target lithographic pattern comprises a plurality of mask elements, regions between the plurality of mask elements comprise spaces, and transforming comprises
identifying critical spaces from the target lithographic pattern, wherein the critical spaces comprises spaces that comprise at least one dimension measuring a critical distance;
identifying intermediate critical spaces, wherein the intermediate critical spaces comprise critical spaces which are separated from an adjoining critical space by an intermediate dimension;
identifying intermediate mask elements, wherein the intermediate mask elements comprise mask elements immediately adjacent to at least one critical space; and
identifying odd and even intermediate mask elements, wherein odd intermediate mask elements comprise every other intermediate mask element along an axis, and wherein even intermediate mask elements comprise remaining intermediate mask elements not designated as odd intermediate mask elements;
decomposing the transformed lithographic pattern into a first decomposed pattern and into a second decomposed pattern; and
fabricating at least one mask set based on the first decomposed pattern and the second decomposed pattern.

25. The method of claim 24, wherein decomposing the transformed lithographic pattern into a first decomposed pattern and into a second decomposed pattern further comprises:
forming a first mask pattern comprising, the forming comprising mapping
the even intermediate mask elements,
the odd intermediate mask elements,
intermediate critical spaces immediately to the right of the even intermediate mask elements,
mask elements not designated as critical mask elements,
critical spaces not designated as intermediate critical spaces into a first mask pattern; and
forming a second mask pattern, the forming comprising mapping
the even intermediate mask elements,
the odd intermediate mask elements,
intermediate critical spaces immediately to the right of the odd intermediate mask elements,
mask elements not designated as critical mask elements, and
critical spaces not designated as intermediate critical spaces into a second mask pattern.

26. The method of claim 24, wherein the plurality of mask elements are transformed into opaque regions, and wherein the transformed lithographic pattern is printed onto a semiconductor wafer as a pattern in a positive photoresist.

* * * * *